United States Patent [19]
Apland et al.

[11] Patent Number: 5,898,776
[45] Date of Patent: Apr. 27, 1999

[54] SECURITY ANTIFUSE THAT PREVENTS READOUT OF SOME BUT NOT OTHER INFORMATION FROM A PROGRAMMED FIELD PROGRAMMABLE GATE ARRAY

[75] Inventors: James M. Apland, Gilroy; David D. Eaton, San Jose; Andrew K. Chan, Palo Alto, all of Calif.

[73] Assignee: QuickLogic Corporation, Sunnyvale, Calif.

[21] Appl. No.: 08/754,461

[22] Filed: Nov. 21, 1996

[51] Int. Cl.⁶ ...................................................... H04L 9/00
[52] U.S. Cl. ...................................... 380/3; 380/4; 326/41
[58] Field of Search ........................ 380/3, 4; 326/39–41

[56] References Cited

U.S. PATENT DOCUMENTS

| | | |
|---|---|---|
| 4,774,421 | 9/1988 | Hartmann et al. . |
| 4,933,898 | 6/1990 | Gilberg et al. ............................... 380/3 |
| 4,947,395 | 8/1990 | Bullinger et al. ....................... 371/22.3 |
| 5,115,435 | 5/1992 | Langford, II et al. ................. 371/22.3 |
| 5,282,271 | 1/1994 | Hsieh et al. ............................. 395/275 |
| 5,296,759 | 3/1994 | Sutherland et al. .................. 307/465.1 |
| 5,336,950 | 8/1994 | Popli et al. .............................. 307/465 |
| 5,349,249 | 9/1994 | Chiang et al. ........................... 307/465 |
| 5,367,209 | 11/1994 | Hauck et al. .............................. 326/45 |
| 5,426,335 | 6/1995 | Agrawal et al. .......................... 326/39 |
| 5,436,514 | 7/1995 | Agrawal et al. .......................... 326/41 |
| 5,450,022 | 9/1995 | New ........................................... 326/39 |
| 5,452,355 | 9/1995 | Coli .............................................. 380/4 |
| 5,457,490 | 10/1995 | Agrawal et al. .......................... 326/39 |
| 5,489,857 | 2/1996 | Agrawal et al. .......................... 326/41 |

OTHER PUBLICATIONS

"Altera Databook", EP1210, pp. 2–15 and 2–24, Second Printing, Jan. (1989).

"Boundary–Scan Test, A Practical Approach", Kluwer Academic Publishers, Harry, Bleeker, Peter van den Eijnden and Frans de Jong, pp. 1–84, (1993).

"Field–Programmable Gate Array Technology", Kluwer Academic Publishers, pp. 51–53 and 179–183 (1994).

Actel "FPGA Data Book and Design Guide", pp. 1–31–1–44, 7–43–7–44, 9–11–9–28 (1993).

Monolithic Memories, "PAL/PLE Device Programmable Logic Array Handbook", pp. 2–103 through 2–114 and pp. 5–4 through 5–18 (1978, 1981, 1983, 1985 and 1986).

"Practial Design Using Programmable Logic", by David Pellerin and Michael Holley, p. 79, (1991).

*Primary Examiner*—Salvatore Cangialosi
*Attorney, Agent, or Firm*—Skjerven, Morrill, MacPherson, Franklin & Friel LLP

[57] ABSTRACT

A field programmable gate array has a security antifuse which when programmed prevents readout of data indicative of how the interconnect structure is programmed but which does not prevent readout of data indicative of which other antifuses are programmed. In some embodiments, the programming control shift registers adjacent the left and right sides are the field programmable gate array are disabled when the security antifuse is programmed but the programming control shift registers adjacent the top and bottom sides of the field programmable gate array are not disabled. A second security antifuse is also provided which when programmed disables a JTAG boundary scan register but does not disable a JTAG bypass register. Information can therefore be shifted through the JTAG test circuitry without allowing the JTAG circuitry to be used to extract information indicative of how the interconnect structure is programmed. Logic module and interface cell scan paths are provided and special test instructions are supported which allow test vectors to be loaded into the logic module and interface cell scan paths.

19 Claims, 8 Drawing Sheets

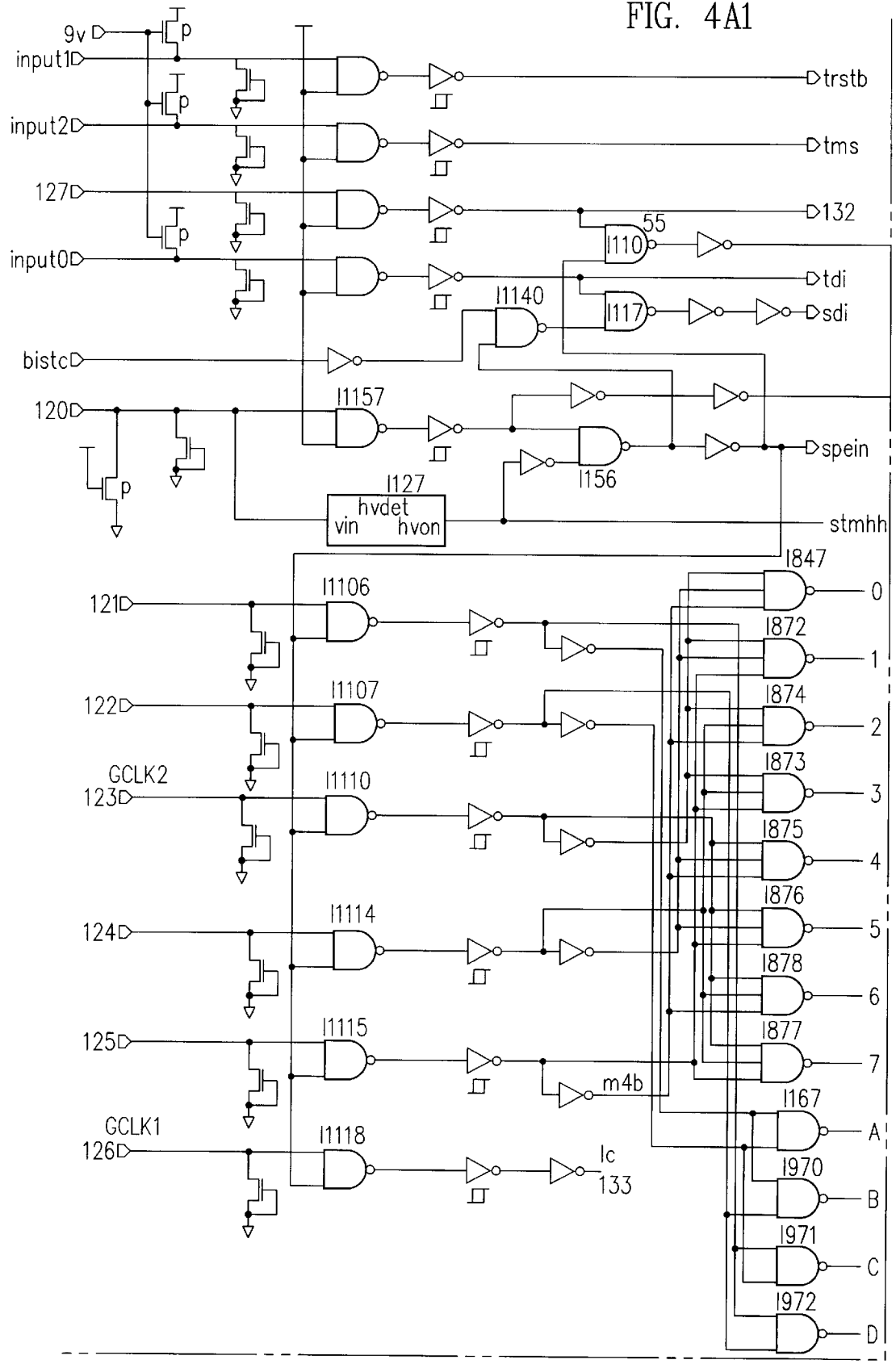
FIG. 4A1

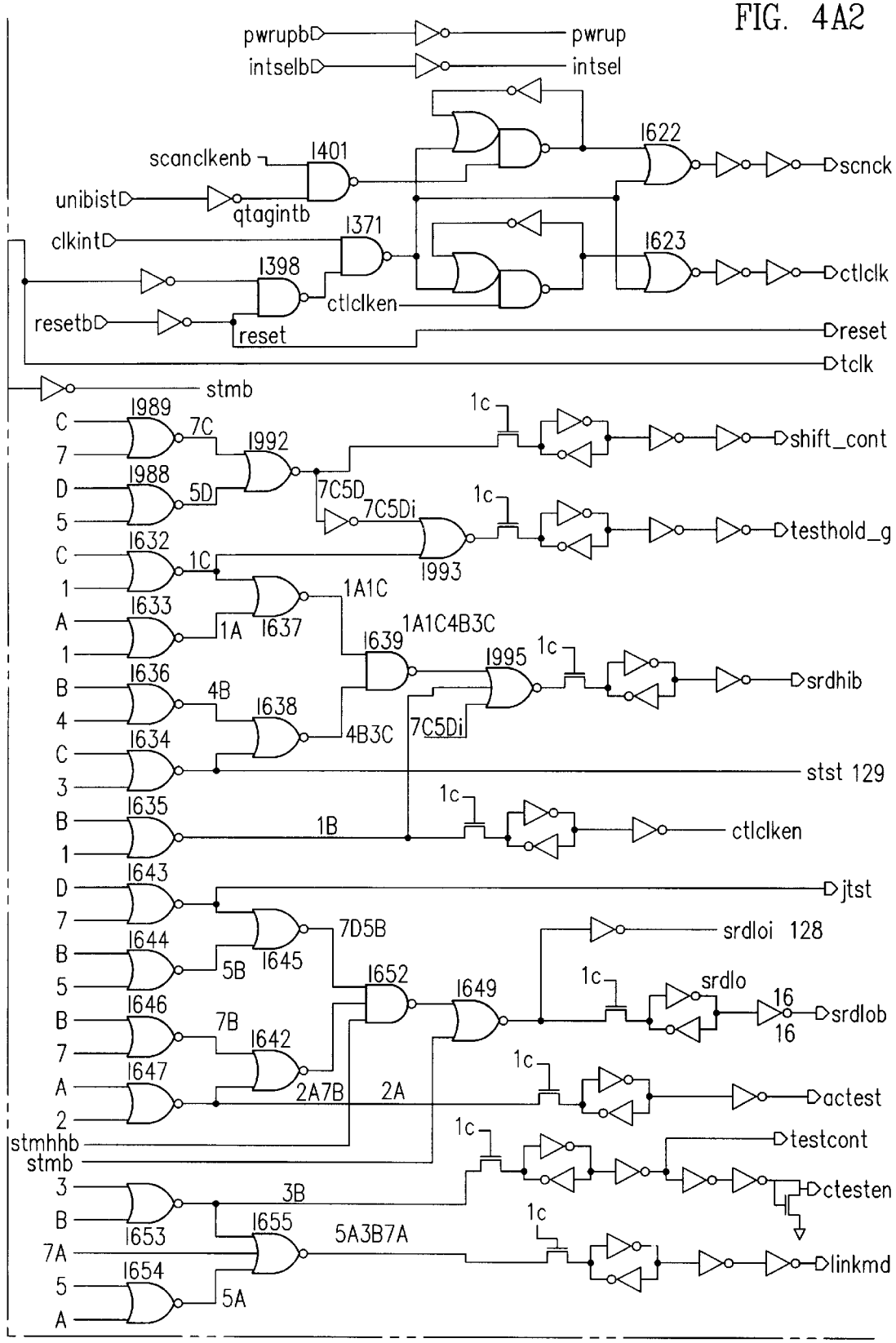
FIG. 4A2

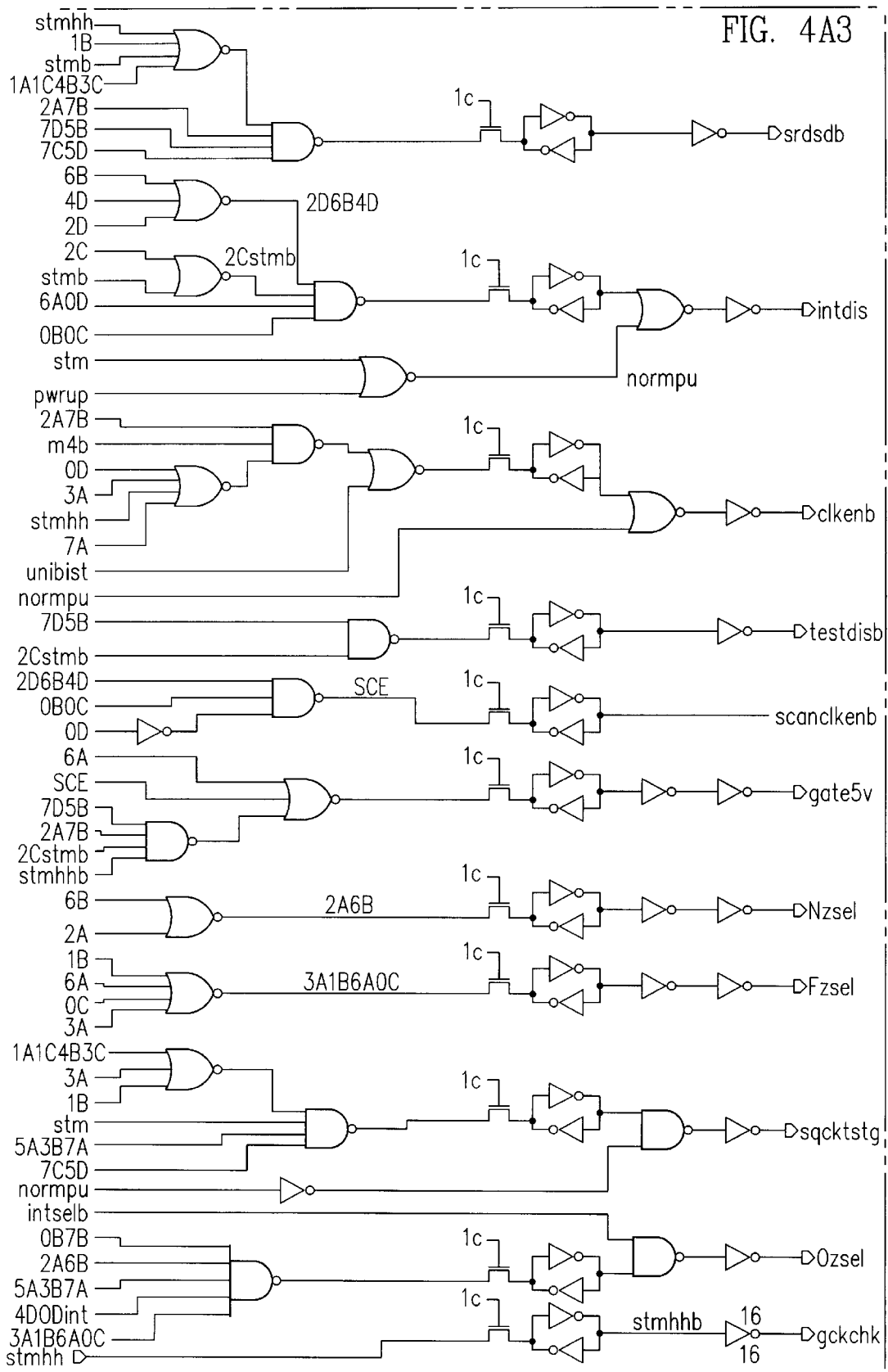
FIG. 4A3

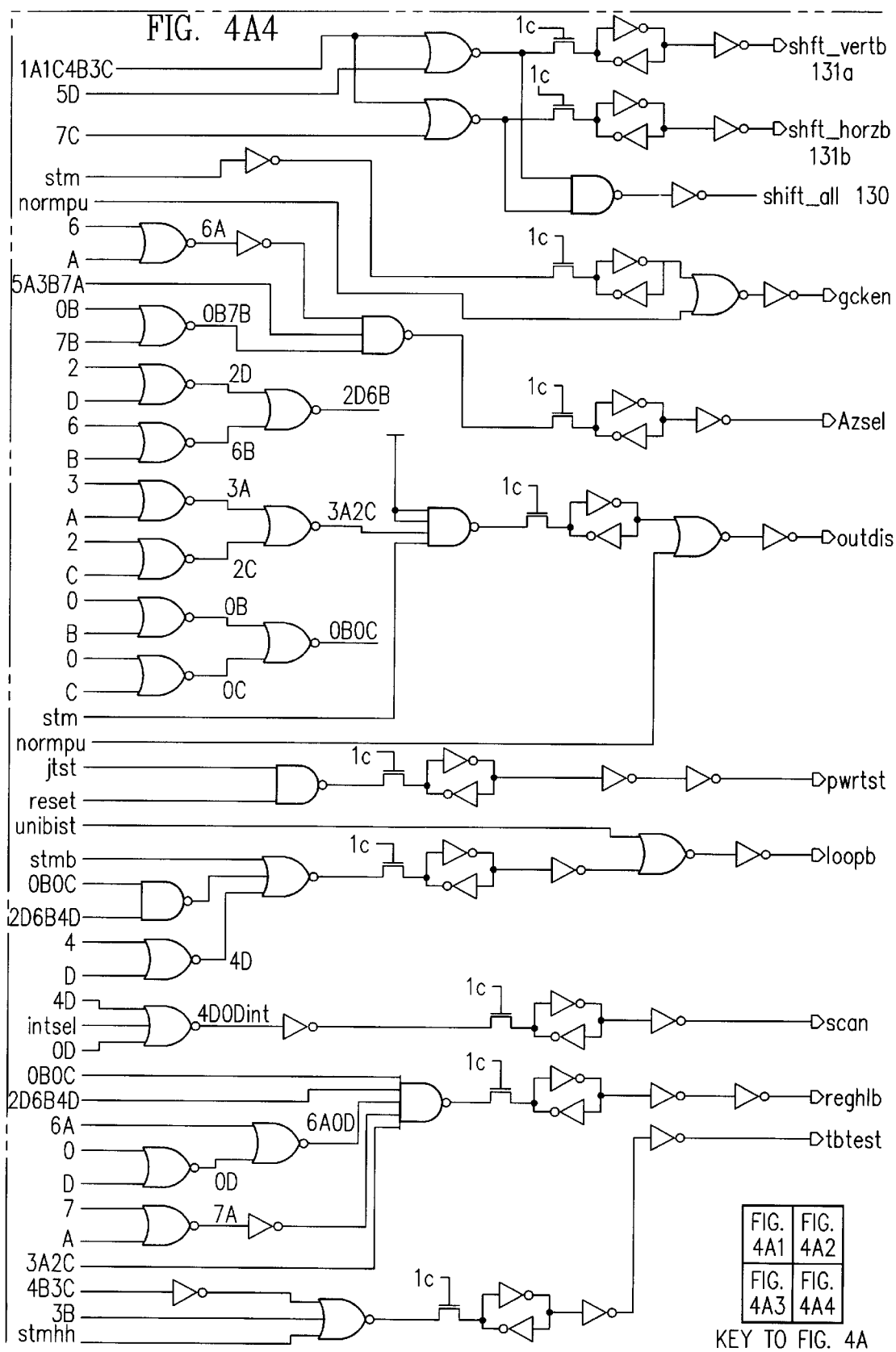

5,898,776

SECURITY ANTIFUSE THAT PREVENTS READOUT OF SOME BUT NOT OTHER INFORMATION FROM A PROGRAMMED FIELD PROGRAMMABLE GATE ARRAY

FIELD OF THE INVENTION

This invention relates to field programmable gate arrays employing antifuses.

BACKGROUND INFORMATION

FIG. 1 (Prior Art) is a simplified top-down diagram of a field programmable gate array 1 having a plurality of logic modules 2 oriented in rows and columns and a plurality of programming control shift registers 3–10. A programmable interconnect structure (not shown) of routing conductors and antifuses is disposed between the logic modules. To realize a user-specific circuit in the field programmable gate array, a user connects selected digital logic elements in selected logic modules together by programming the appropriate antifuses of the programmable interconnect structure.

FIG. 2 (Prior Art) is a simplified top-down diagram illustrating the programming of an antifuse 11 to connect horizontal routing conductor 12 and vertical routing conductor 13. A programming control driver (not shown) of programming control shift register 3 places a high voltage (VHH) at least one threshold above a programming voltage (VPP) onto vertically extending programming control conductor 14 to turn programming transistor 15 on. A programming control driver (not shown) of programming control shift register 10 places VHH onto horizontally extending programming control conductor 16 to turn programming transistor 17 on. Next, a programming driver (not shown) of programming control shift register 3 drives programming voltage VPP onto vertically extending programming conductor 18 and a programming driver (not shown) of programming control shift register 10 drives ground potential (GND) onto horizontally extending programming conductor 19. A programming current therefore flows as indicated by the arrows through antifuse 11 to program it.

It may be desired that the user-specific circuit programmed into a field programmable gate array not be readily decipherable by others once the antifuses of the interconnect structure are programmed. It is, however, possible to use the programming control shift registers 3–10 to determine which antifuses in the interconnect structure are programmed and which are not. For example, it is possible to determine whether anitfuse 11 is programmed by loading the programming control shift registers 3 and 10 as illustrated in FIG. 2 and then measuring the magnitude of a current flowing through the field programmable gate array (for example, into the VPP terminal of the field programmable gate array). If there is no current flow, then antifuse 11 is not programmed. If, on the other hand, there is current flow, then antifuse 11 is programmed. By successively testing each antifuse in this way, it may be possible to determine which antifuses are programmed and which antifuses are not programmed and therefore to decipher the user-specific circuit programmed into the field programmable gate array. A circuit is desired which will prevent such testing of antifuses.

It may, however, be desirable to be able to interrogate a programmed field programmable gate array and to determine whether or not certain other antifuses have been programmed. Two different types of field programmable gate array devices may, for example, be packaged in the same type of package having the same number of external terminals. If before the packages are marked, the two packaged field programmable gate arrays are intermixed, then it would be difficult to determine which type of field programmable gate array is in a particular package. It is therefore desirable to provide an antifuse on each field programmable gate array which can be read after it is programmed. If, for example, this antifuse is read as being in a programmed state, then it is determined that the field programmable gate array in the package is of a first type. If, on the other hand, the antifuse is read as not be in a programmed state, then it is determined that the field programmable gate array in the package is of a second type.

A field programmable gate array is therefore desired wherein some antifuses of the interconnect structure cannot be read after programming but wherein other antifuses can be read after programming.

SUMMARY

A field programmable gate array has a security antifuse which when programmed prevents readout of data indicative of how the interconnect structure is programmed but which does not prevent readout of data indicative of which other antifuses are programmed. In some embodiments, the programming control shift registers adjacent the left and right sides of the field programmable gate array are disabled when the security antifuse is programmed but the programming control shift registers adjacent the top and bottom sides of the field programmable gate array are not disabled. A second security antifuse is also provided which when programmed disables a JTAG boundary scan register but does not disable a JTAG bypass register. Information can therefore be shifted through some JTAG register paths but the path that allows the JTAG circuitry used to extract information (indicative of how the interconnect structure is programmed) is disabled. Logic module and interface cell scan paths are provided and special JTAG test instructions are supported which allow test vectors to be loaded into the logic module and interface cell scan paths.

This summary does not purport to define the invention. The invention is defined by the claims.

BRIEF DESCRIPTION OF THE DRAWINGS

FIG. 4A1–4A4 is a more detailed diagram of the test decode logic block 119 of FIG. 4.

DETAILED DESCRIPTION OF THE PREFERRED EMBODIMENTS

Figure 1:
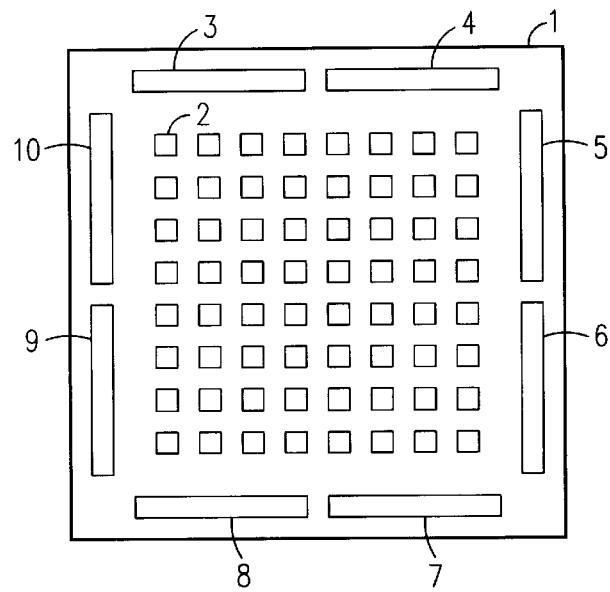
FIG. 1 (Prior Art) is a simplified top-down diagram of a field programmable gate array.
Figure 2:
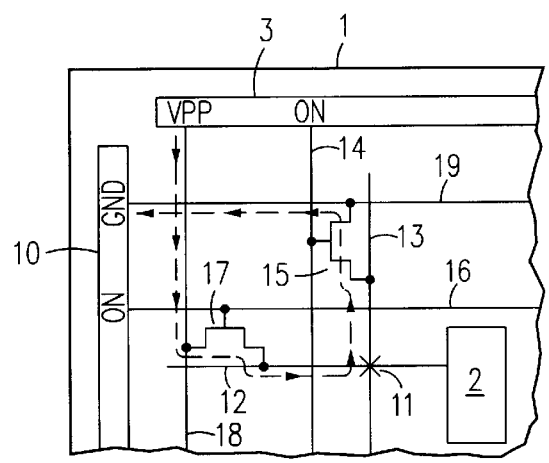
FIG. 2 (Prior Art) is a simplified top-down diagram illustrating how an antifuse in the field programmable gate array of FIG. 1 can be tested to determine if it is programmed.
Figure 3:
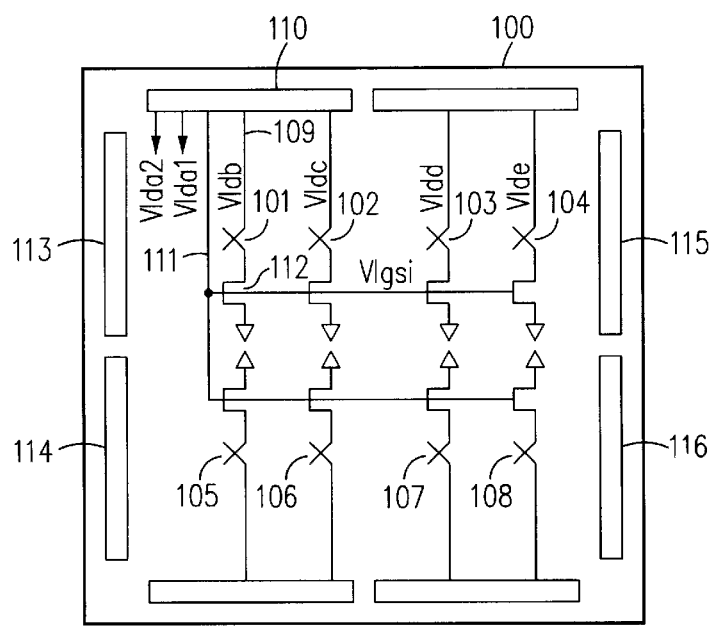
FIG. 3 is a simplified top-down diagram of a field programmable gate array in accordance with an embodiment of the present invention wherein the programming control shift registers adjacent the left and right sides of the field programmable gate array are disabled by programming a security antifuse but wherein the programming control shift registers adjacent the top and bottom sides are not disabled.

FIG. 3 is a simplified top-down diagram of a field programmable gate array 100 in accordance with an embodiment of the present invention. Antifuses 101–108 are antifuses which are not used to interconnect logic modules, but rather are provided so that they can be programmed to store information. The antifuses may, for example, be amorphous silicon antifuses such as set forth in U.S. Pat. No. 5,557,136 (the subject matter of this patent is incorporated herein by reference).

Consider antifuse 101. The programming conductor 109 by which the programming voltage VPP is supplied to one electrode of antifuse 101 is driven by the same programming control shift register 110 as the programming control conductor 111 which controls the programming transistor 112 which grounds the other electrode of antifuse 101. Accordingly, the programming control shift registers 113–116 adjacent the left and right sides of the field programmable gate array can be disabled after programming of the antifuses of the interconnect structure (not shown) and the antifuses 101–108 can still be read using the programming control shift registers adjacent the top and bottom sides of the field programmable gate array. To read antifuse 101, for example, the programming control shift register 110 is loaded such that voltage VHH is present on the programming control conductor 111. Programming control shift register 110 is then controlled such that a voltage is driven onto conductor 109 (but not onto the programming conductors of the other antifuses 101–108). If a current flows into the field programmable gate array (for example, into a VPP terminal of the field programmable gate array), then it is determined that the antifuse through which the current must be flowing (antifuse 101 in this case) is in a programmed state. If a current does not flow, then it is determined that the antifuse 101 is not in a programmed state. It is therefore seen that the programming control shift registers 113–116 adjacent the left and right sides of the field programmable gate array can be disabled and the antifuses 101–108 can still be read.

In accordance with one embodiment, the programming control shift registers adjacent the left and right sides of the field programmable gate array are disabled to prevent information indicative of which antifuses of the interconnect structure have been programmed from being extracted from the field programmable gate array. The programming control shift registers adjacent the top and bottom sides of the field programmable gate array are, however, not disabled but rather are usable to extract information indicative of which of the antifuses 101–108 are programmed. For additional details on programming control shift registers and a field programmable gate array employing programming control shift registers, see: U.S. patent application Ser. No. 08/667,702, entitled "Programming Architecture For A Programmable Integrated Circuit Employing Antifuses", by Paige A. Kolze, et al., filed Jun. 21, 1996 (the subject matter of this document is incorporated herein by reference).

Figure 4:
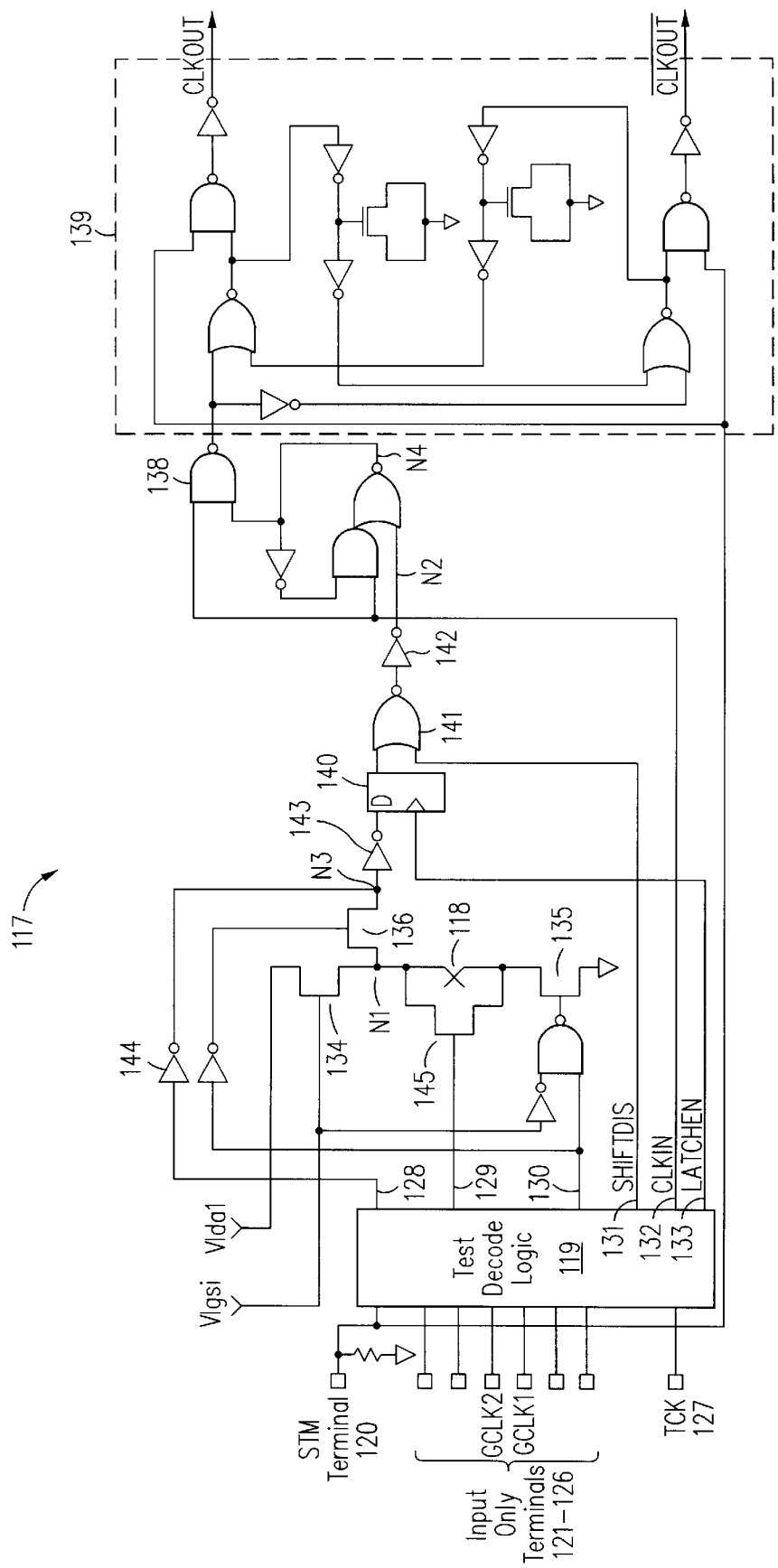
FIG. 4 is a simplified circuit diagram of a circuit 117 for disabling the left and right programming control shift registers of FIG. 3.

FIG. 4 is a simplified circuit diagram of a circuit 117 for disabling the left programming control shift registers 113 and 114 and the right programming control shift registers 115 and 116 of FIG. 3 without disabling the top and bottom programming control shift registers of FIG. 3. Circuit 117 includes a security antifuse 118 which can be programmed after the antifuses of the interconnect structure are programmed such that shifting of the left and right programming control shift registers is permanently prevented. Test decode logic 119 decodes the values on an STM (special test mode) terminal 120, six input only terminals 121–126, and a TCK (test clock) terminal 127 to generate the digital logic levels on output leads 128–133. FIG. 4A is a more detailed diagram of a specific embodiment of the test decode logic block 119 of FIG. 4.

The field programmable gate array can either be in a "normal operation mode" or can be in a "special test mode". The special test mode (defined by a digital logic high on the STM terminal) has multiple modes including a "shift model" and a "link mode". One combination of digital values on the six input only terminals 121–126 is decoded to indicate the "shift mode". This combination is placed on input only terminals 121–126. In the shift mode, programming data can be shifted into programming control shift registers that are not disabled. TCK terminal 127 is used (as explained further below) to clock the programming data into programming control shift registers. In this way, digital logic ones are loaded into the shift register bits corresponding with Vlgsi and Vldal. Because the field programmable gate array is in the shift mode and not the link mode, the programming driver associated with the Vlgsi conductor is not enabled despite the corresponding shift register bit being loaded with a digital one. A digital logic low is output onto the programming control conductor Vlgsi. Programming control conductor Vlgsi is also shown in FIG. 3. As a result, transistor 134 is nonconductive. Output lead 129 carries a digital logic low throughout this period. Because transistor 134 is off, Vldal (which also supplies other nodes in the device) is not pulled low in shift mode if security antifuse 118 is programmed. Nodes except those associated with Vlgsi (such as N1) are thus precharged in this mode to an intermediate voltage (for example, 6 volts). Because signal 130 from test decode logic 119 is decoded to be low, transistors 135 and 136 are on. If security antifuse 118 is programmed, then node N3 is low and shifting in the vertical direction is blocked.

Next, another combination of digital values is placed on the six input only terminals 121–126 to place the field programmable gate array into the "link mode". When in the link mode, programming drivers associated with shift register bits that hold digital high values are enabled to output the programming voltage VPP. Because the shift register bits associated with vertically extending programming conductor Vldal and Vlgsi contain digital logic highs, the programming driver driving conductor Vldal is enabled and transistor 134 is on. The conductive path that now exists through transistors 134 and 135 is blocked by the unprogrammed security antifuse 118.

Next, the magnitude of the voltage on the VPP terminal of the field programmable gate array is increased (for example, from 6 volts to 12 volts). As a result, a programming current flows through security antifuse 118 to ground and security antifuse 118 is programmed. Next, the magnitude of the voltage on the VPP terminal is decreased (for example, from 12 volts to 6 volts) and the current flowing into the VPP terminal of the field programmable gate array is measured to make sure the security antifuse 118 is in fact programmed. This measuring step is performed to make sure that the programming current actually flowed through the security antifuse 118 and not through a leakage path to ground (for example, through a leakage path in transistor 134 to substrate). If the current at the decreased voltage is adequately large indicating that the security antifuse 118 is programmed (for example, 4 mA), then a digital logic level low is supplied onto the STM terminal 120 to take the field programmable gate array out of the special test mode.

If one were to attempt to use the left and right programming control shift registers 113–116 to determine which antifuses of the interconnect structure were programmed, then the field programmable gate array would be placed into the shift mode to clock the appropriate digital values into the programming control shift registers (including the left and right programming control shift registers) so that current flow or the lack thereof could be observed through a particular antifuse. In the shift mode, the programming control shift registers are clocked by placing a clock signal on TCK terminal 127. This clock signal is converted into clock signal CLKIN on output lead 132 by buffering in the test decode logic 119. If the digital logic level at node N2 is a digital low, then the CLKIN signal on output lead 132 is passed through NAND gate 138 and is converted into non-overlapping clock signals CLKOUT and $\overline{\text{CLKOUT}}$ by a non-overlapping clock signal generating circuit 139.

If, however, security antifuse 118 is programmed and the field programmable gate array is in the shift mode, then transistors 135 and 136 are controlled to be on. A digital logic level low is therefore present on node N3, a digital logic high is latched into latch 140, and a digital logic high is passed onto node N2 through NOR gate 141 and inverter 142. If a digital logic level high is present on node N2, then a digital logic level low is present on node N4. NAND gate 138 therefore outputs a digital logic level high regardless of whether clock signal CLKIN is switching or not. The clock signal passing into the left and right programming control shift registers is blocked (gated by NAND gate 138) such that the left and right programming control shift registers cannot be shifted.

To ensure that the programming control shift registers can only shift in the "shift mode", the test decode logic 119 controls the SHIFTDIS signal on output lead 131 to be high (shifting is disabled) except when in the shift mode. Latch 140 is provided to prevent transients due to decoding signal skews from inadvertently clocking the left and right programming control shift registers. Transistor 136 blocks the high programming voltage VPP present on node N1 during security antifuse programming from damaging the input of inverter 143.

In link mode, transistor 136 is off. To prevent the input of inverter 143 from floating and thereby resulting in current being drawn by inverter 143 when security antifuse 118 is not programmed (node N3 should be high), node N3 is pulled up by a small inverter 144. Test decode logic 119 controls small inverter 144 to function as a weak pullup on node N3 in link mode and shift mode. If security antifuse 118 is programmed, node N3 will be pulled down in shift mode through large transistors 135 and 136 despite the weak pullup action of small inverter 144.

Pass transistor 145 is provided to facilitate testing of the security circuit. When a special shift security mode is entered by placing the proper code on the input only terminals 121–126 and bringing STM terminal 120 high, signal 129 is forced high turning transistor 145 on. Transistor 145 thus shorts across security antifuse 118, thereby simulating the action of security antifuse 118 being in a programmed state. Data is then shifted through the programming shift registers to determine if the circuit properly blocks vertical programming control shift register shifting but not horizontal programming control shift register shifting.

To read the information stored in the programming pattern of antifuses 101–108 after security antifuse 118 is programmed, the shift mode is entered, a digital logic level high is loaded into the bit of the top programming control shift register 110 corresponding with the Vlgsi and a digital logic level high is loaded into the bit corresponding with a desired one of the antifuses 101–108. The link mode is then entered and the magnitude of the voltage on the programming voltage VPP terminal of the field programmable gate array is increased to 6 volts. The current flowing into the VPP terminal is measured using, for example, a HP82000 characterization system. If the current is, for example, above 4 mA, then the desired antifuse is determined to be in the programmed state. This process is repeated for each of the other antifuses 101–108 and is possible despite the fact that the left and right programming control shift registers cannot be shifted.

Information stored in antifuses 101–108 may include: 1) a device identification number (indicating, for example, 3 k gates or 5 k gates), 2) whether the device is a high voltage or low voltage device (for example, 5 volts Vcc or 3 volts Vcc), 3) whether the device was successfully programmed, 4) whether the device successfully passed automatic test vector testing, 5) the mask option of the device, 6) a checksum of the design programmed into the device, 7) a code indicative of an error which occurred in programming, 8) an indication of the software revision used to program the device, 9) an identification number of the programmer used to program the device, 10) the number of the wafer from which the device originated, 11) the date programmed, 12) an indication of an adjustment made at wafer sort, 13) an indication of an adjustment made at final test, and/or 14) an indication of an adjustment made by the programmer. Other information may also be stored.

Figure 5:
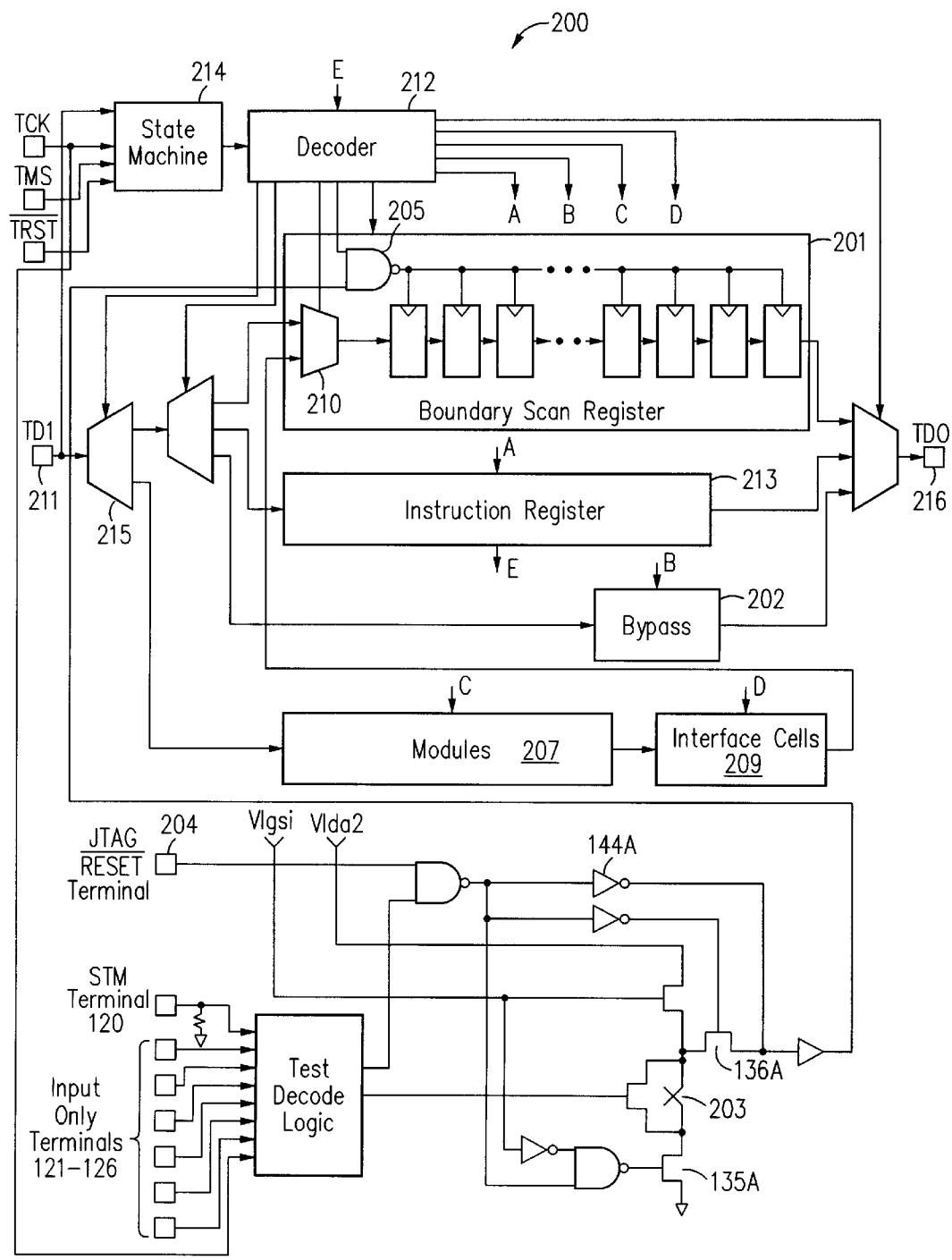
FIG. 5 is a simplified diagram of a circuit 200 for disabling a JTAG boundary scan register but for leaving a JTAG bypass register functional after antifuses of the interconnect structure of a field programmable gate array have been programmed.

FIG. 5 is a simplified diagram of a circuit 200 for disabling a Joint Test Action Group (JTAG—IEEE Standard 1149.1) boundary scan register 201 but for leaving a JTAG bypass register 202 functional after the antifuses of the interconnect structure of the field programmable gate array have been programmed. Because it may be possible to decipher the user-specific circuit programmed into the field programmable gate array using the JTAG boundary scan register 201, a security antifuse 203 is provided. When this security antifuse 203 is in a programmed state, shifting of the boundary scan register 201 is prevented. For additional background information on JTAG boundary scan registers, instruction registers, bypass registers and the control of those registers see the text "Boundary-Scan Test", by Barry Bleeker et al., Kluwer Academic Publishers, 1993, pages 1–84 (the subject matter of this text is incorporated herein by reference).

The Vlgsi and Vlda2 conductors of FIG. 5 are also illustrated in FIG. 3. Programming of the security antifuse 203 of FIG. 5 is similar to the programming of the security antifuse 118 of FIG. 4. The JTAG $\overline{\text{RESET}}$ terminal 204 is provided so that the circuit does not draw current through inverter 144A and transistors 136A and 135A unnecessarily. The JTAG boundary scan security circuit is active and therefore could potentially draw current if security antifuse 203 is programmed and the JTAG circuitry is not in the reset state. In the embodiment illustrated in FIG. 5, information from boundary scan register 201 cannot be extracted from the field programmable gate array after security antifuse 203 is programmed because the clock signal supplied to the boundary scan register is gated with a NAND gate 205. It is understood, however, that numerous other methods of preventing information in the boundary scan register 201 from being extracted from the field programmable gate array are possible. Shifting of the boundary scan register 201 may, for example, be enabled but a path from the output of the boundary scan register to an output terminal of the field programmable gate array may be blocked.

Figure 6:
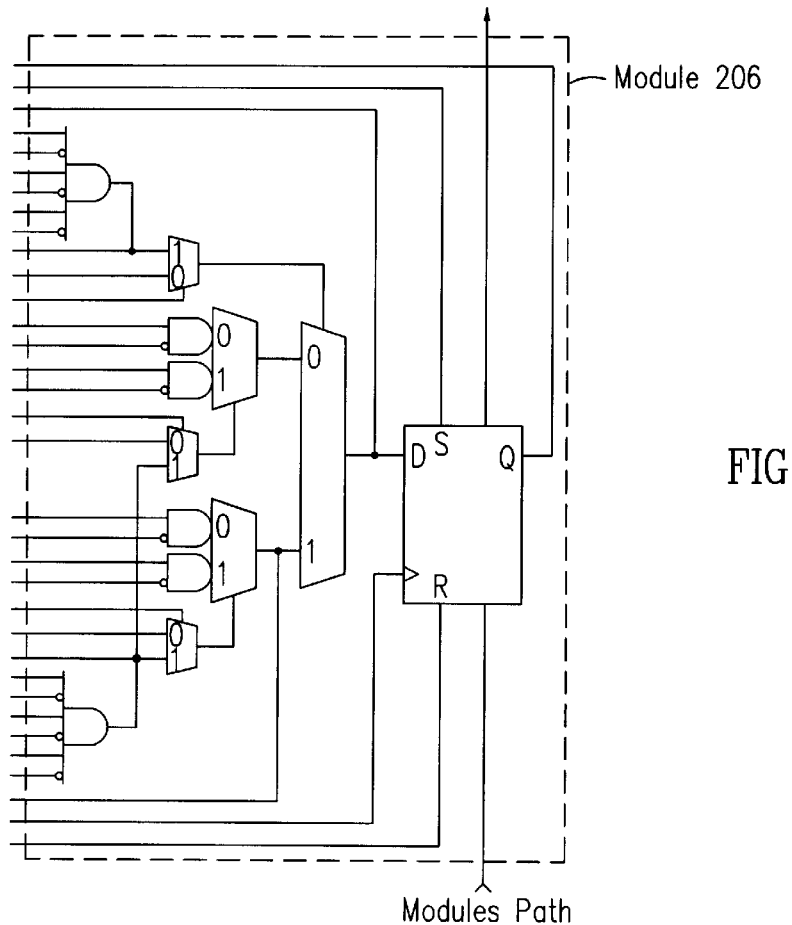
FIG. 6 is a top-down diagram illustrating a scan path through a logic module.
Figure 7:
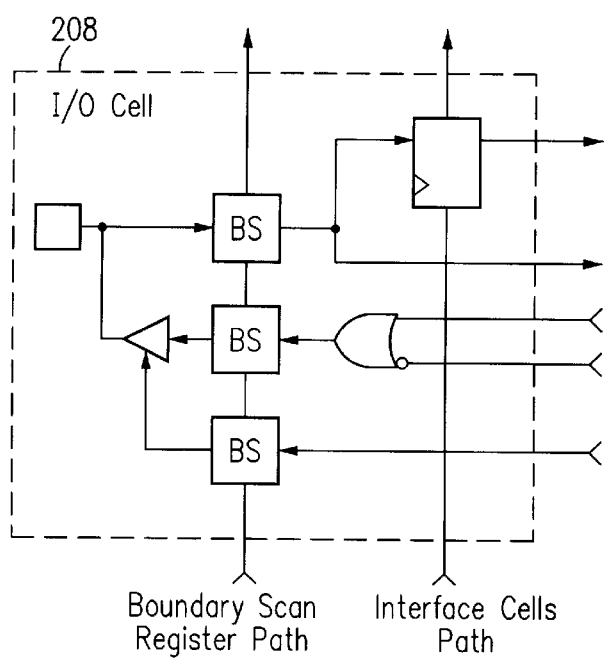
FIG. 7 is a top-down diagram illustrating a scan path through an interface cell.

In the embodiment of FIG. 5, a scan path extends through the sequential logic elements in the logic modules as well as through the sequential logic elements in the interface cells. FIG. 6 illustrates the scan path through the sequential logic element in one logic module 206. The sequential logic element has a scan path input lead and in this case a scan path output lead. The scan path output lead of one such logic module is coupled to the scan path input lead of the next such logic module to form a logic module scan path represented in FIG. 5 by block 207. FIG. 7 illustrates the scan path through an interface cell 208. A scan path through numerous chained interface cells is represented in FIG. 5 by block 209.

To prevent the use of the module scan path 207 or the interface cells scan path 209 to extract information from the field programmable gate array in the special PBIST JTAG instruction after the security antifuse is programmed, the serial output lead of the interface cells scan path 209 is coupled to the serial input lead of the boundary scan register 201. A multiplexer 210 is provided in the boundary scan register 201 such that information can be clocked into the boundary scan register from input terminal TDI 211 or from the serial output lead of the interface cells scan path block 209. Inhibiting clocking of the boundary scan register 201 therefore prevents information in the modules and interface cells scan paths from being read out of the field programmable gate array.

In some embodiments, special JTAG instructions are supported. For example, if decoder 212 detects one such special JTAG instruction (called "pBIST") in instruction register 213, then a demultiplexer 215 is switched such that serial information from terminal 211 can be clocked into the modules scan path 207. Multiplexer 210 is also switched to receive the serial output of the interface cells scan path 209. A test vector can therefore be loaded into all the sequential logic elements of the modules scan path 207, the interface scan path 209 and the boundary scan register 201. Test data in the sequential logic elements of the modules scan path 207, the interface scan path 209 and the boundary scan register 201 can also be read out of the field programmable gate array via TDO terminal 216. Another special instruction (called "UNICLK") may also be provided which when executed clocks each of the sequential logic elements in the logic modules and the interface cells scan paths once to load the sequential logic elements in parallel with test information.

In one embodiment, a test vector is shifted from the TDI terminal 211 into the modules scan path 207, the interface scan path 209 and the boundary scan register 201 using the pBIST instruction. After the test vector is loaded, resulting test data output by the circuit under test is parallel loaded (captured) into the bits of the boundary scan register 201 by repeating the RTI state in the JTAG sequence more than once while in the PBIST instruction. Another special UNI-CLK instruction is then entered. During this instruction, staying in the RTI state for more than one clock cycle generates a signal which clocks all the modules 207 and interface cells 209. This operation captures the result of the input vector into these registers. Another pBIST instruction is then executed and the sequential elements of the boundary scan 201, interface cells 209 and modules 207 are scanned out. Because the normal JTAG capture state has been disabled in pBIST, the data in the boundary scan registers is not lost when the capture DR state is entered prior to entering the shift DR state to shift out the sequential elements.

Although the present invention is described in connection with certain specific embodiments for instructional purposes, the present invention is not limited thereto. Numerous other circuits for programming a security antifuse under the control of digital values present on certain terminals of a field programmable gate array are possible. Programming of a security antifuse need not be restricted to occur only during link mode operation. The antifuses can be any suitable type including amorphous silicon and ONO types. The specifics of the JTAG circuitry can be adapted for particular applications and particular field programmable gate array architectures. Logic module and interface cell scan paths can be incorporated into the JTAG test circuitry without serializing the logic module and interface cell scan paths with the boundary scan register scan path. In some embodiments, the data supplied to programming control shift registers is gated rather than the clock signal supplied to programming control shift registers. Accordingly, various modifications, adaptations, and combinations of various features of the described embodiments can be practiced without departing from the scope of the invention as set forth in the following claims.

What is claimed is:

1. A field programmable gate array, comprising:
   a plurality of modules;
   a plurality of first antifuses of a programmable interconnect structure, selected ones of said first antifuses being programmed, said first antifuses being programmable to interconnect selected ones of said logic modules;
   a plurality of second antifuses, selected ones of said second antifuses being programmed, said second antifuses not being programmable to interconnect said logic modules and not being part of the programmable interconnect structure; and
   means for preventing first data indicative of which ones of said first antifuses are programmed from being extracted from said field programmable gate array while second data indicative of which ones of said second antifuses are programmed is extracted from said field programmable gate array.

2. The field programmable gate array of claim 1, wherein said second data indicative of which ones of said second antifuses are programmed is extractable by imposing a voltage across one of said second antifuses and determining whether a current flows into said field programmable gate array, through said second antifuse, and out of said field programmable gate array, and then repeating said imposing and said determining for each other of said second antifuses.

3. The field programmable gate array of claim 1, wherein said means for preventing includes:
   means for preventing said first data from being extracted from said field programmable gate array if said means is in a programmed state said means being a security antifuse.

4. The field programmable gate array of claim 1, further comprising:
   a first programming control shift register capable of driving a voltage onto first programming conductors extending in a first direction; and
   a second programming control shift register capable of driving a voltage onto second programming conductors extending in a second direction perpendicular to said first direction, said means preventing shifting of said second programming control shift register but not preventing shifting of said first programming control shift register.

5. The field programmable gate array of claim 4, wherein said first programming control shift register controls a first plurality of programming control conductors, each of said first plurality of programming control conductors extending in said first direction, and wherein said second programming control shift register controls a second plurality of programming control conductors, each of said second plurality of programming control conductors extending in said second direction.

6. The field programmable gate array of claim 1 having a plurality of terminals, said means for preventing comprising:
   a security antifuse; and
   means for enabling a programming current to flow through said security antifuse when a first combination of digital values is present on said plurality of terminals of said field programmable gate array, and for preventing a programming current from flowing through said security antifuse when other combinations of digital values are present on said plurality of terminals of said field programmable gate array.

7. The field programmable gate array of claim 6, wherein said means for enabling a programming current comprises:
   a programming pass transistor disposed in parallel with said security antifuse; and
   a decoder having a plurality of input leads and an output lead, said input leads being coupled to said plurality of terminals, said output lead being coupled to a gate of said programming pass transistor.

8. The field programmable gate array of claim 1, further comprising:
   a shift register, said means for preventing gating a clock signal and thereby blocking said clock signal from clocking said shift register.

9. A field programmable gate array, comprising:
   a boundary scan register; and
   a boundary scan disable circuit preventing information in said boundary scan register from being shifted out of said field programmable gate array when a security antifuse of said boundary scan disable circuit is in a programmed state.

10. The field programmable gate array of claim 9, further comprising:
    a bypass register, programming of said security antifuse not preventing shifting of said bypass register.

11. The field programmable gate array of claim 9, wherein said boundary scan disable circuit has an output lead which is coupled to an input lead of said boundary scan register, a predetermined digital value being present on said output lead of said disable circuit if said security antifuse is in a programmed state.

12. The field programmable gate array of claim 11, wherein said boundary scan disable circuit prevents information in said boundary scan register from being shifted out of said field programmable gate array by gating a clock signal supplied to said boundary scan shift register.

13. The field programmable gate array of claim 9, further comprising:
    a plurality of logic modules, each of said logic modules having a sequential logic element with a scan path, said scan paths of said sequential logic elements being chained together to form a logic module scan path.

14. The field programmable gate array of claim 13, wherein said boundary scan register comprises an input multiplexer, a data input lead of said input multiplexer being coupled to said logic module scan path such that information in said sequential logic elements of said logic modules can be shifted through said boundary scan register.

15. The field programmable gate array of claim 9, further comprising:
    a plurality of interface cells, each of said interface cells having a sequential logic element with a scan path, said scan paths of said sequential logic elements of said interface cells being chained together to form an interface cell scan path.

16. The field programmable gate array of claim 15, wherein said boundary scan register comprises an input multiplexer, a data input lead of said input multiplexer being coupled to said interface cell scan path such that information in said sequential logic elements of said interface cells can be shifted through said boundary scan register.

17. The field programmable gate array of claim 9 having a plurality of terminals, said boundary scan disable circuit comprising:
    said security antifuse;
    a decoder having input leads and an output lead, said input leads being coupled to said plurality of terminals of said field programmable gate array; and
    a programming circuit for programming said security antifuse, said programming circuit having an input lead coupled to said output lead of said decoder.

18. A field programmable gate array, comprising:
    a bypass register;
    a logic module scan path extending through a plurality of logic modules;
    a terminal;
    a security antifuse not usable to interconnect logic modules; and
    means for preventing, when said security antifuse is in a programmed state, information in said logic module scan path from being shifted out of said field programmable gate array onto said terminal but not preventing information in said bypass register from being shifted through said bypass register and out of said field programmable gate array onto said terminal.

19. The field programmable gate array of claim 18, further comprising:
    a plurality of terminals; and
    means for programming said security antifuse when a predetermined combination of digital values are present on said plurality of terminals.

* * * * *